US006115475A

United States Patent [19]

Alexander

[11] Patent Number: 6,115,475

[45] Date of Patent: Sep. 5, 2000

[54] CAPACITOR-LESS CROSSOVER NETWORK FOR ELECTRO-ACOUSTIC LOUDSPEAKERS

[75] Inventor: Eric Alexander, South Ogden, Utah

[73] Assignee: Diaural, L.L.C., Ogden, Utah

[21] Appl. No.: 09/121,753

[22] Filed: Jul. 23, 1998

[51] Int. Cl.[7] ..................... H03G 5/00

[52] U.S. Cl. ..................... 381/99

[58] Field of Search ..................... 381/99, 100, 98; 333/172, 181

[56] References Cited

U.S. PATENT DOCUMENTS

| | | | |
|---|---|---|---|
| 3,155,774 | 11/1964 | Howell | 381/99 |
| 3,814,857 | 6/1974 | Thomasen | 381/99 |
| 3,931,469 | 1/1976 | Elliott et al. . | |
| 4,031,318 | 6/1977 | Pitre . | |
| 4,037,051 | 7/1977 | Fuselier . | |
| 4,229,619 | 10/1980 | Takahashi et al. | 179/1 D |
| 4,237,340 | 12/1980 | Klipsch | 179/1 D |
| 4,475,233 | 10/1984 | Watkins | 381/99 |
| 4,504,704 | 3/1985 | Ohyaba et al. . | |
| 4,597,100 | 6/1986 | Grodinsky et al. | 381/99 |
| 4,638,505 | 1/1987 | Polk et al. | 381/24 |
| 4,653,103 | 3/1987 | Mori et al. | 381/99 |
| 4,771,466 | 9/1988 | Modafferi | 381/99 |
| 4,887,609 | 12/1989 | Cole, Jr. | 128/696 |
| 4,897,879 | 1/1990 | Geluk | 381/99 |
| 4,991,221 | 2/1991 | Rush | 381/120 |
| 5,153,915 | 10/1992 | Farella | 381/205 |
| 5,302,917 | 4/1994 | Concorso | 330/264 |

OTHER PUBLICATIONS

Terman, Frederick. Radio Engineers' Handbook, McGraw–Hill Book Company, Inc., pp. 249–251, Jan. 1943.

*Primary Examiner*—Vivian Chang
*Attorney, Agent, or Firm*—Workman Nydegger Seeley

[57] ABSTRACT

A crossover network for partitioning by frequency an electrical audio signal from an amplifier into a plurality of frequency bands, namely a high frequency band, and a low frequency band, and alternatively a high frequency band, a mid-range frequency band, and a low frequency band. The crossover network is implemented in a simplified configuration without the required use of capacitors and in a series configuration which reduces cost and component matching complexity. In one embodiment, the high frequency driver is configured in shunt with an inductor with a resistive component connected at least partially in shunt with the low frequency driver. This crossover network provides improved performance and simplified crossover network implementation.

20 Claims, 6 Drawing Sheets

2 WAY

2 WAY

3 WAY

3 WAY

4 WAY or MORE

CAPACITOR-LESS CROSSOVER NETWORK FOR ELECTRO-ACOUSTIC LOUDSPEAKERS

BACKGROUND OF THE INVENTION

1. The Field of the Invention

This invention relates generally to electro-acoustic or audio loudspeaker systems. More particularly, the invention relates to a partitioning by frequency of the electrical audio signal from the output of an audio amplifier, into a plurality of frequency bands for presentation to the electro-acoustic transducers within a loudspeaker system.

2. Present State of the Art

Audio systems present as an audible signal, simultaneous divergent audio frequencies for example music or speech for appreciation by a user. The divergent frequency content of audio may generally be considered to consist of differing frequencies. While an audio system may reinforce or reproduce the electrical audio frequency spectrum in a single pair of wires or input to a speaker, specific physical implementations of speaker components are optimized for responding to a compatible band of frequencies. For example, low frequencies tend to be better replicated by physically larger drivers commonly known as woofers. Mid-range frequencies, likewise, are more favorably reproduced by a mid-range sized driver. Additionally, higher frequencies are better reproduced by physically smaller drivers commonly known as tweeters.

While an amplifier may electrically deliver the entire audio frequency spectrum to a speaker over a single pair of wires, it is impractical to expect that the high, middle and low frequencies autonomously seek out the corresponding tweeter drivers, mid-range drivers and woofer drivers within a speaker. In fact, connecting high-power, low-frequency signals to a tweeter driver, will cause audible distortion and will typically cause fatigue and destruction of the tweeter driver.

Therefore, modern higher-fidelity audio system speakers incorporate a crossover that divides the electrical audio frequency spectrum received in a single pair of wires into distinct frequency bands or ranges and ensures that only the proper frequencies are routed to the appropriate driver. That is to say, a crossover is an electric circuit or network that splits the audio frequencies into different bands for application to individual drivers. Therefore, a crossover is a key element in multiple-driver speaker system design.

Crossovers may be individually designed for a specific or custom system, or may be commercially purchased as commercial-off-the-shelf crossover networks for both two and three-way speaker systems. In a two-way speaker system, high frequencies are partitioned and routed to the tweeter driver with low frequencies being routed to the woofer driver. A two-way crossover, which uses inductors and capacitors, accomplishes this partitioning when implemented as an electrical filter. Crossover networks have heretofore incorporated at least one or more capacitors, and usually one or more inductors, and may also include one or more resistors, which are configured together to form an electrical filter for partitioning the particular audio frequencies into bands for presentation to the appropriate and compatible driver.

FIG. 1 depicts a typical two-way crossover network within a speaker system. The crossover network of FIG. 1 may be further defined as a first-order crossover network since the resultant response of each branch of the network attenuates the signal at 6 dB per octave. The graph of FIG. 1 depicts the responses of a woofer driver and a tweeter driver resulting in a first-order crossover in a two-way speaker system. An amplifier provides signal into input pair 10 comprised of a positive input 12 and a negative input 14. In the upper branch 16 of crossover network 8, the high frequencies are filtered and allowed to pass to high frequency driver 18. Filtering is performed by capacitor 20 which inhibits the passing of lower frequencies and allows the passing of higher frequencies to high frequency driver 18. Such a portion of the crossover network is commonly referred to as a "high pass" filter.

Lower frequencies are filtered through branch 22 of crossover network 8 to low frequency driver 24 through the user of the filtering element shown as inductor 26. This portion of the crossover network is commonly referred to as a "low pass" filter. It should be pointed out that crossover networks typically implement the partitioning of the frequencies into bands through the use of network branches which are parallelly configured across positive input 12 and negative input 14 of input pair 10.

The graph of FIG. 1 illustrates the frequency responses of a woofer and tweeter driver resulting from the two-way crossover network 8. Crossover network 8 is depicted as a first order crossover in a two-way speaker system. The low frequency or woofer response 28 begins rolling off at approximately 200 Hertz. As depicted in FIG. 1, at 825 Hertz, the woofer response 28 is attenuated to a negative 3 dB from the reference response of 0 dB. Tweeter response 30 is increasing in magnitude at a rate of 6 dB per octave and at 825 Hertz is also a negative 3 dB from the reference response of 0 dB. However, after 825 Hertz, tweeter response 30 increases to 0 dB while woofer response 28 continues to roll off at a rate of 6 dB per octave. The intersection of the curves depicting the woofer and tweeter response defines the "crossover frequency." Frequencies above the crossover frequency presented at input pair 10 increasingly follow the lower impedance path of branch 16 terminating at the high frequency or tweeter driver 18 rather than the higher impedance path, through branch 22, which leads to the low frequency or woofer driver 24. An implementation for selection of the crossover frequency must be carefully evaluated and selected by weighing certain characteristics to avoid further difficulties or less than ideal matching of the crossover network to the drivers of the speaker system.

FIG. 1 depicts a first-order crossover network which has a characteristic rate of attenuation of 6 dB per octave. FIG. 2 depicts a second-order crossover network which has a characteristic rate of attenuation of 12 dB per octave. FIG. 3 depicts a third-order crossover network which has a characteristic rate of attenuation of 18 dB per octave. FIG. 4 depicts a fourth-order crossover network which has a characteristic rate of attenuation of 24 dB per octave. This demonstrates that to obtain higher rates of attenuation, the number of elements in the network increases in each parallel branch of the crossover network.

Higher order crossover networks are sharper filtering devices. For example, a first order crossover network attenuates at the rate of −6 dB per octave while a second order crossover network attenuates at the rate of −12 dB per octave. Therefore, if a sufficiently low crossover frequency was selected and a first order crossover network is employed, a substantial amount of lower frequencies will still be presented to the tweeter. What this means is that such an effect causes undesirable audible distortion, limits power handling, and can easily result in tweeter damage that could be avoided by using a higher order crossover network filter.

While FIGS. 1–4 have depicted crossover networks, such examples depict that crossover networks are generally implemented as a parallel set of individual filters. Furthermore, crossover networks have heretofore required the inclusion of at least one capacitive component such as capacitor 20 for providing the requisite filtering or partitioning of the electrical audio spectrum into frequency bands. Those familiar with high-fidelity appreciate that capacitors are less than ideal components for use at speaker level signals. Furthermore, the tolerances associated with capacitors tend to lead to quite expensive component costs when attempting to accurately match or characterize components for a speaker system. Additionally, those familiar with audio systems also appreciate that the component cost, which largely includes the cost of individual components such as the capacitive components used in a crossover network, significantly affect the overall price of an audio system and in particular, the overall price associated with speakers.

Thus, what is needed is a system for partitioning the electrical audio frequency spectrum as presented by an amplifier into a plurality of frequency bands for presentment to drivers capable of reproducing the audible signal. What is yet further needed is a system for minimizing the component cost associated with an audio system, in particular speakers, through the reduction of the overall number of components required as well as through the use of more reliable and less expensive components.

SUMMARY AND OBJECTS OF THE INVENTION

It is an object of the present invention to provide an apparatus for implementing a crossover network in speaker system that performs frequency partitioning of the electrical audio signal into bands without the use of explicit capacitors within the crossover network circuit.

It is yet another object of the present invention to provide an apparatus for providing frequency partitioning of the electrical audio signal into bands through the use of a crossover network that requires less components to implement than traditional crossover networks.

It is still a further object of the present invention to provide a crossover network architecture that enables the cascading of N individual drivers to form an N-way speaker system.

The present invention provides a new capacitor-less filter network for implementing a crossover network for speaker systems. The capacitor-less crossover network working in accord with all type drivers, effectively divides electrical audio, low, mid and high bands into specific frequency spectrums for presentment to individual drivers. The crossover network of the present invention performs the crossover network functionality without the incorporation of explicit capacitors into the crossover network.

The crossover network of the present invention results in improved impedance and phase characteristics. The capacitor-less crossover network of the present invention employs fewer components than traditional crossover networks. When implemented according to the disclosure of the present invention, the capacitor-less crossover network partitions the electrical audio spectrum thereby resulting in improved power handling over traditional crossover networks.

In the crossover network of the present invention, the inductor effectively routes lower frequency signals to the designated low frequency driver simultaneously while resisting higher frequencies. Therefore, the path of least resistance for the high frequencies in an exemplary network in accordance with the present invention will be the high frequency driver.

The resistor, in the capacitor-less crossover network of the present invention, functions to restore higher frequency loss due to series inductance while simultaneously leveling the impedance of the overall network. The favorable results of the present invention are dictated by the characteristics of the components employed in the corresponding network. Therefore, the capacitor-less crossover network functions as a unit and changes to individual elements of the crossover network will result in re-adjusted performance of the entire speaker system.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
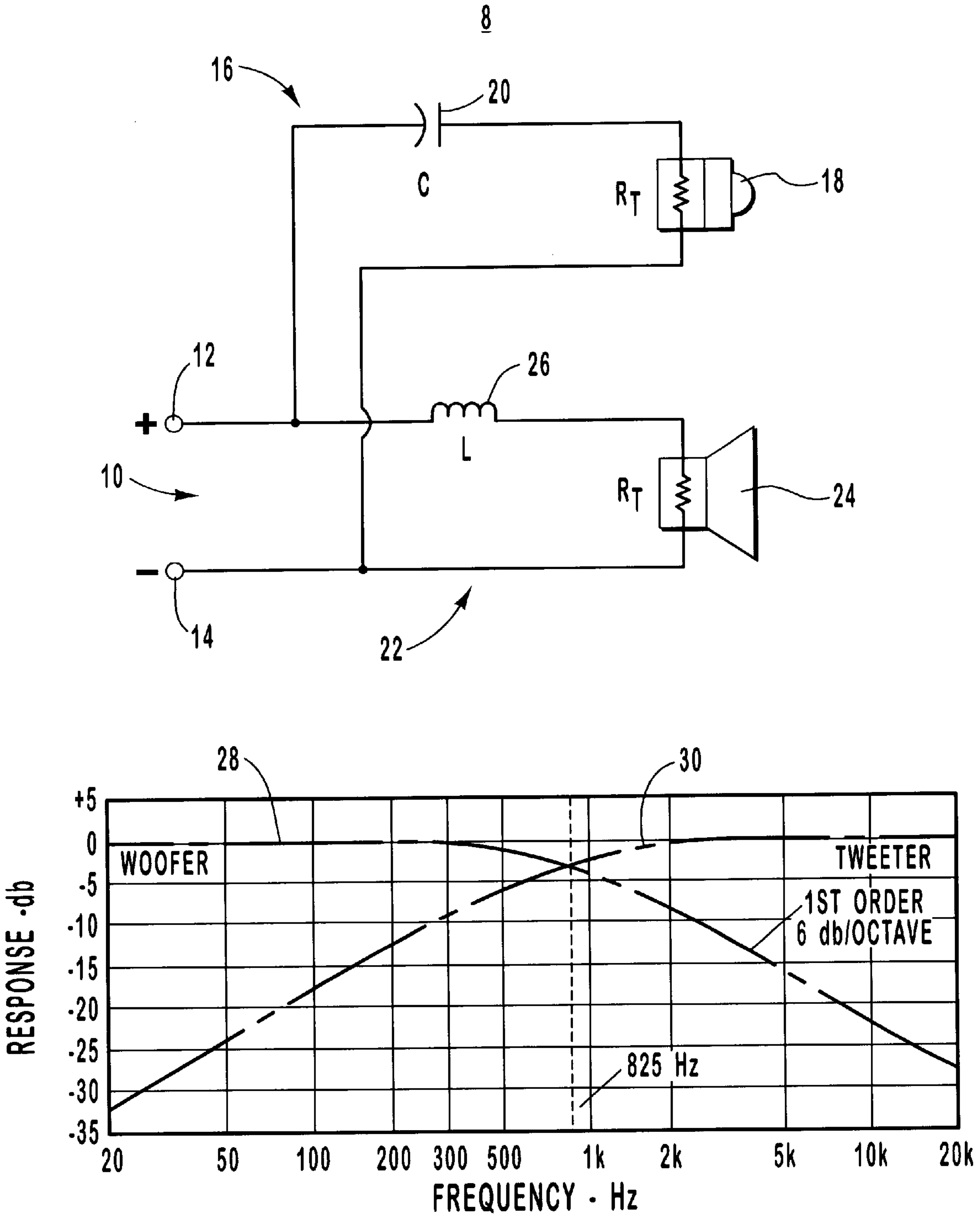
FIG. 1 (PRIOR ART)
FIGS. 1–4 are simplified diagrams of crossover networks employing at least one capacitor, in accordance with the prior art.
Figure 2:
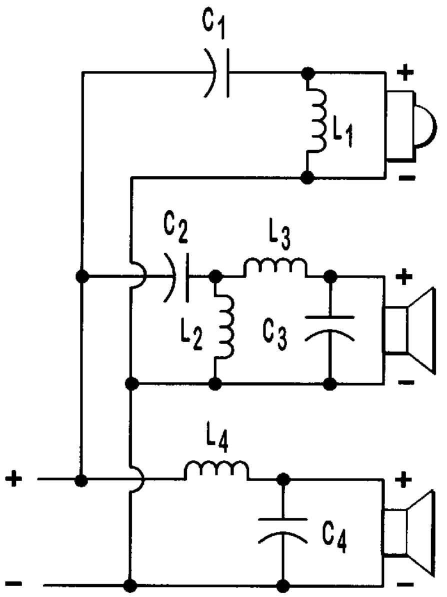
FIG. 2 (PRIOR ART)
Figure 3:
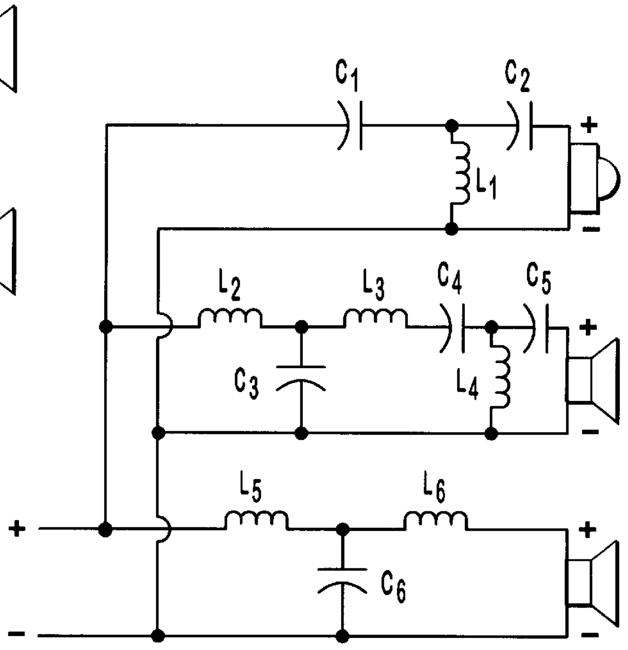
FIG. 3 (PRIOR ART)
Figure 4:
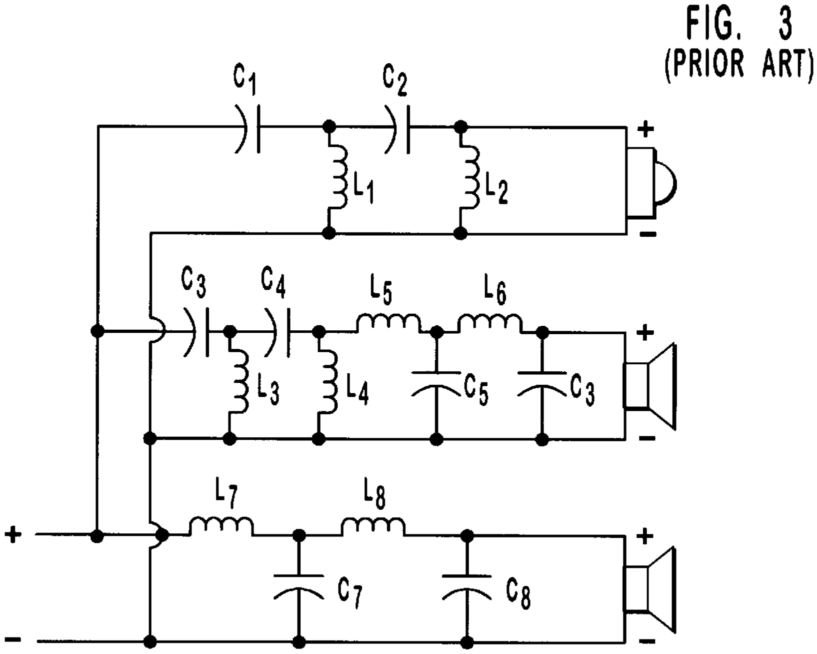
FIG. 4 (PRIOR ART)

As used herein, the term "amplifier" refers to any device or electronic circuit which has the capability to strengthen an electrical audio signal to sufficient power for use by an attached loudspeaker. These devices are frequently referred to as power amplifiers, or amps.

As used herein, the term "source device" refers to an apparatus for the generation of an electrical audio signal, such as a device which develops electrical audio frequency signal wholly within itself, for example a test signal generator. An apparatus for the generation of an electrical audio frequency signal from an originally acoustic action, for example a microphone. An apparatus for the generation of an electrical audio frequency signal from an originally mechanical action, for example an electric guitar, or electronic keyboard. An apparatus for the generation of an electric audio frequency signal from recorded or programmed media, for example a tape player, phonograph, compact disc player, or synthesizer. An apparatus for the generation of an electric audio frequency signal from a radio frequency (RF) broadcast, for example a tuner.

As used herein, the term "pre-amplifier" refers to an apparatus which is inserted electrically between source device(s) and amplifier(s) to perform control functions, and otherwise condition or process the electrical audio frequency signal before connecting it to the input of an amplifier. For example, selection between source devices, simultaneous blending or mixing of two or more source devices, volume, tone control, equalization, and/or balance. If such control is not desired and electrical signal from the source device is of compatible characteristic, then a source device may be connected directly to the input of an amplifier. One or more of the above functions may also sometimes be found incorporated within a source device or within an amplifier.

As used herein, the term "electro-acoustic transducer" refers to an apparatus for the conversion of an electrical audio frequency signal to an audible signal.

As used herein, the term "driver" refers to an electro-acoustic transducer most commonly connected to the output of an amplifier, either directly or via an electrically passive filter, also sometimes referred to as a "raw speaker".

As used herein, the term "speaker" refers to an apparatus consisting typically of a box-like enclosure with two or more drivers and an electrically passive filter installed therein, for the purpose of converting the electrical audio frequency signal of, for example, music or speech to the audible signal of such music or speech. Said drivers would be different in regard to the portion of the audible frequency spectrum which they were designed to accommodate.

As used herein, the term "electrically passive filter" refers to at least one electrical element, for example a capacitor, or inductor wired in-circuit between the output of an amplifier and the input of a driver, the purpose of which is to attenuate frequencies inappropriate to a specific driver, typically located within the box-like enclosure of the speaker.

As used herein, the term "crossover" refers to at least one electrically passive filter.

As used herein, the term "audio system" refers to any device or set of devices which contain a speaker, an amplifier, a pre-amplifier and a source device.

The present invention embodies within its scope an apparatus for partitioning an electrical audio spectrum as generated by an audio system amplifier into a plurality of frequency bands for powering the corresponding drivers in a speaker. The frequency partitioning process of the present invention is accomplished through the use of a crossover network that does not require capacitors for partitioning the electrical audio spectrum. Furthermore, the present invention employs an architecture wherein the filter branches of the crossover network that partition the electrical audio spectrum into frequency bands are series-configured rather than the typical parallel-configurations in the prior art. The purpose of the invention is to provide a means for reducing the number of components required and changing the types of components required to implement a crossover network.

The present invention further provides a crossover network that is not encumbered by the degenerative effects of capacitors in the crossover network. The results of employing the present invention include a smoothing resultant effect on the impedance curve of a speaker. Furthermore, power handling associated with a grouping of drivers within a speaker is also noticeably improved thereby increasing the overall system dynamic range.

Additionally, due to the accommodating nature of the crossover network of the present invention, design efforts traditionally associated with crossover networks, are greatly reduced, yielding a decreased development time and a lower unit cost.

Figure 5:
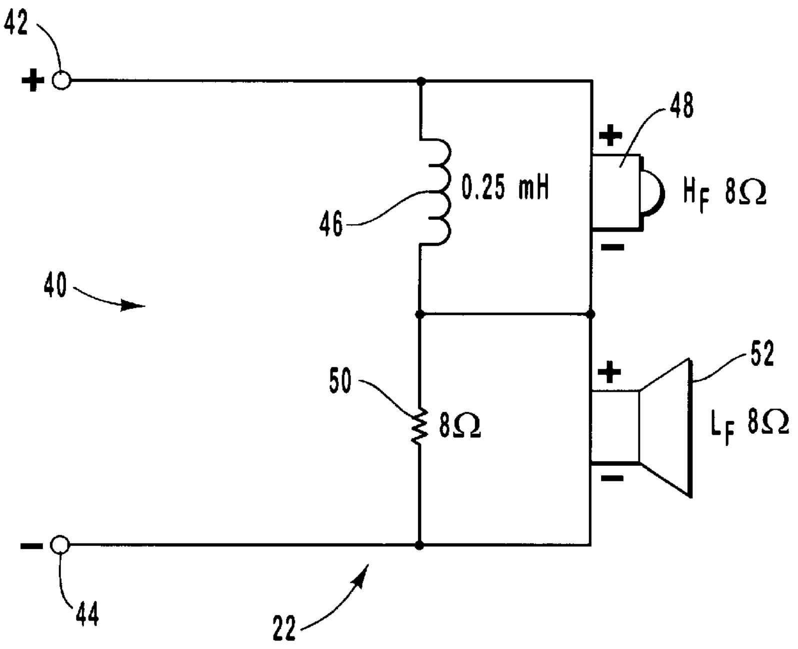
FIG. 5 depicts a simplified circuit diagram of a two-way series-configured capacitor-less crossover network, in accordance with a preferred embodiment of the present invention.

FIG. 5 depicts a simplified schematic diagram of a series-configured capacitor-less two-way crossover network, in accordance with a preferred embodiment of the present invention. An electrical audio signal as presented at the output of the amplifier in an audio system is comprised of simultaneous divergent audio frequencies and is attached to the input of the crossover via an input pair 40 having a positive input 42 and a negative input 44 into the series-configured capacitor-less crossover network of the present invention. To facilitate the partitioning of the electrical audio signal into frequency bands, the capacitor-less crossover network of the present invention is comprised of an inductor 46 having a first input end that electrically and conductively couples with positive input 42. Inductor 46 is electrically coupled in shunt or parallel with high frequency electroacoustic transducer 48 which is also known as a tweeter 48 or high frequency driver 48. High frequency driver 48 is preferably oriented such that the positive input is electrically and conductively coupled with positive input 42 and the first input end of inductor 46. Likewise, the negative input of high frequency driver 48 is coupled to a second input end of inductor 46 thereby completing the shunt or parallel configuration as depicted in FIG. 5.

The two-way capacitor-less crossover network as depicted in FIG. 5 is further comprised of a shunt resistor 50 for partially bypassing a portion of the signal around the low frequency driver 52 in a shunt or parallel configuration. Low frequency electro-acoustic transducer 52 is known to those of skill in the art as a low frequency driver or woofer 52. Low frequency driver 52 is preferably configured such that the positive input of low frequency driver 52 is electrically and conductively coupled severally with a first end of shunt resistor 50, the second input end of inductor 46 as well as the negative input of high frequency driver 48. To complete the parallel configuration, a second end of shunt resistor 50 is electrically and conductively coupled to a negative input of low frequency driver 52 and the negative input 44 of input pair 40. Possible values for resistor 50 include resistors having a range from approximately 4Ω to ∞ depending on driver characteristics.

Typical values for inductor 46 include the inductors having a range from approximately 0.1 milliHenry to a range of 1 milliHenry for a high frequency driver 48 exhibiting an impedance of approximately 4 to 10 ohms, and a suggested frequency response of 2 KHz and higher. One exemplary type of high frequency driver 48 is an electro-dynamic dome tweeter. It should be pointed out that while the present example specifies a 1 inch electro-dynamic dome tweeter, all known types of high frequency drivers may be employed.

Figure 6:
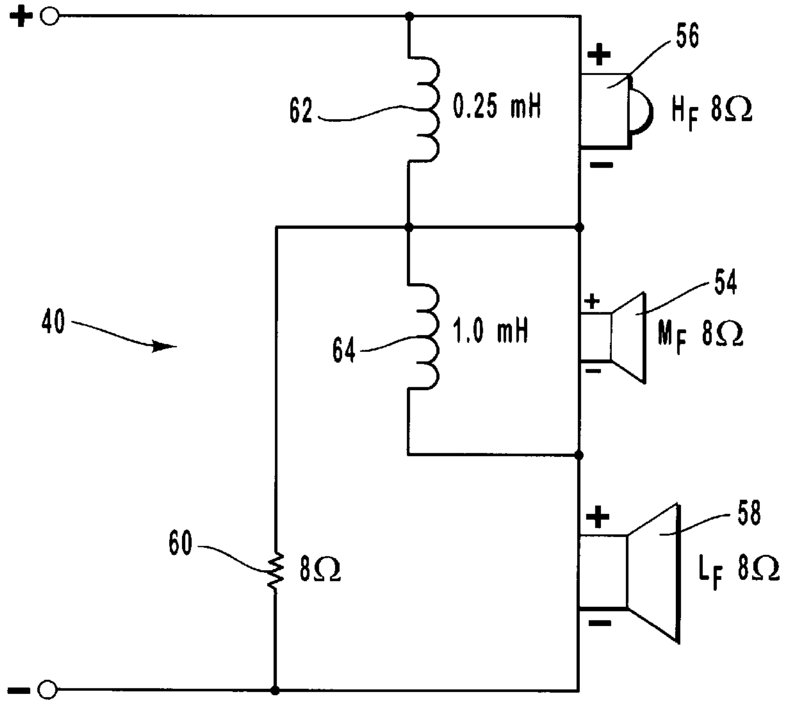
FIG. 6 depicts a simplified circuit diagram of a three-way series-configured capacitor-less crossover network, in accordance with a preferred embodiment of the present invention.

FIG. 6 depicts a simplified schematic diagram of a series-configured capacitor-less 3-way crossover network, in accordance with a preferred embodiment of the present invention. Like FIG. 5, the three-way crossover network of FIG. 6 is depicted as receiving an electrical audio signal via input pairs 40. However, the three-way crossover network of FIG. 6 includes an additional mid frequency electro-acoustic transducer 54, also known as a mid-range driver, for optimally transducing to acoustic energy the mid-range frequencies of the presented electrical audio signal.

The three-way capacitor-less crossover network as depicted in FIG. 6 is further comprised of a shunt resistor 60 for electrically and conductively coupling in a shunt or parallel configuration with the series connected low frequency driver 58, and mid frequency driver 54. To complete the parallel configuration, the second end of shunt resistor 60 is electrically and conductively coupled to a negative end input of low frequency driver 58.

Similar to the two-way crossover network of FIG. 5, the three-way crossover network of FIG. 6 is also comprised of an inductor 62 coupled in shunt with high frequency driver 56 and in series with shunt resistor 60. Also serially coupled to inductor 62 is inductor 64 coupled in shunt with mid frequency driver 54. Exemplary component values for the elements of the three-way crossover network of FIG. 6 include a typical value for inductor 62 of 0.25 milliHenries with a high frequency driver 56 having an impedance of approximately 8 ohms, and a frequency response of 5 KHz and higher. Furthermore, inductor 64 may assume an exemplary value of 1.0 milliHenry with a mid frequency driver 54 having an impedance of approximately 8 ohms and a frequency response of 500–5 KHz, and a low frequency driver 58 having a typical impedance of approximately 8 ohms, and a frequency response of 500 Hz and lower. Additionally, shunt resistor 60 in the three-way configuration of FIG. 6 may also assume an exemplary value of 8 ohms. While these values depict only exemplary values for a specific implementation, other resistive and inductive values may be employed that provide unique behavior in the three-way crossover network of the present invention.

Figure 7:
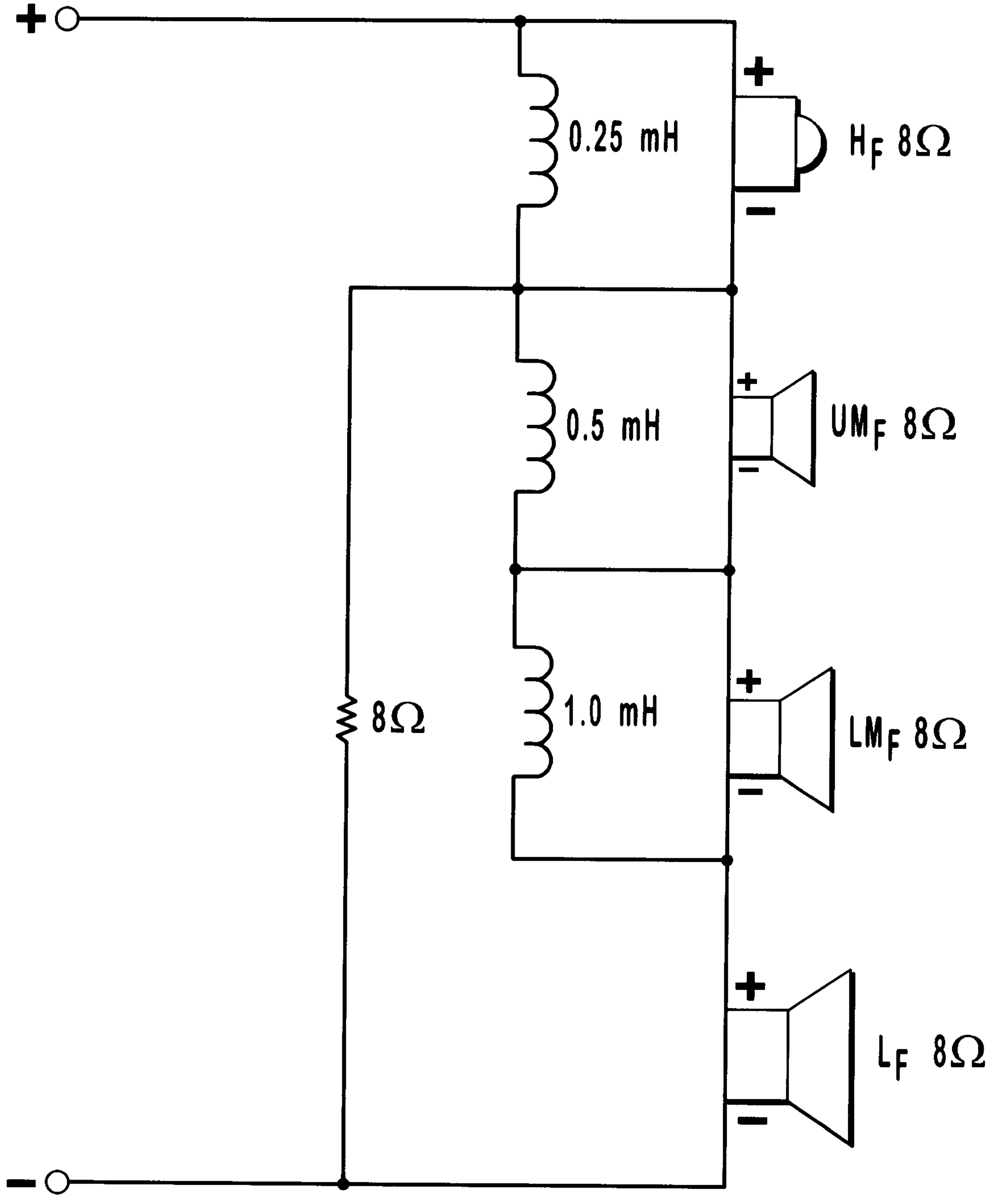
FIG. 7 depicts a simplified circuit diagram of a four-way series-configured capacitor-less crossover network, in accordance with a preferred embodiment of the present invention.
Figure 8:
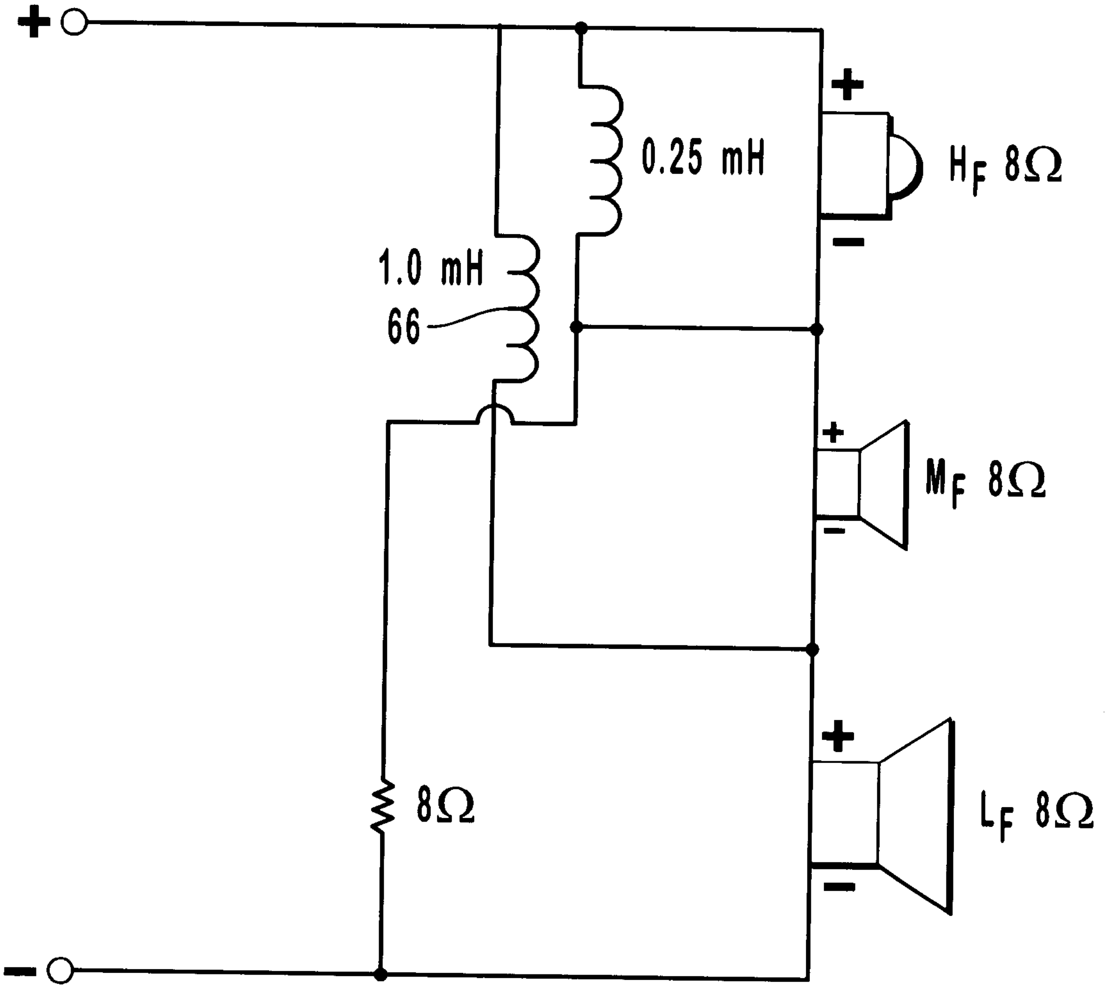
FIG. 8 depicts a simplified circuit diagram of a three-way series-parallel-configured capacitor-less crossover network, in accordance with another preferred embodiment of the present invention.

FIG. 7 depicts a four-way series-configured capacitor-less crossover network that may even be extendable to an N-way crossover network in accordance with the present invention. FIG. 8 depicts a four-way speaker system comprised of a high frequency driver, an upper-mid frequency driver, a lower-mid frequency driver and a low frequency driver. FIG. 7 also depicts the typical inductor and resistor values for implementing such a series-configured capacitor-less crossover network. It should be pointed out that the capacitor-less crossover network may also be extended to an N-way system.

Figure 9:
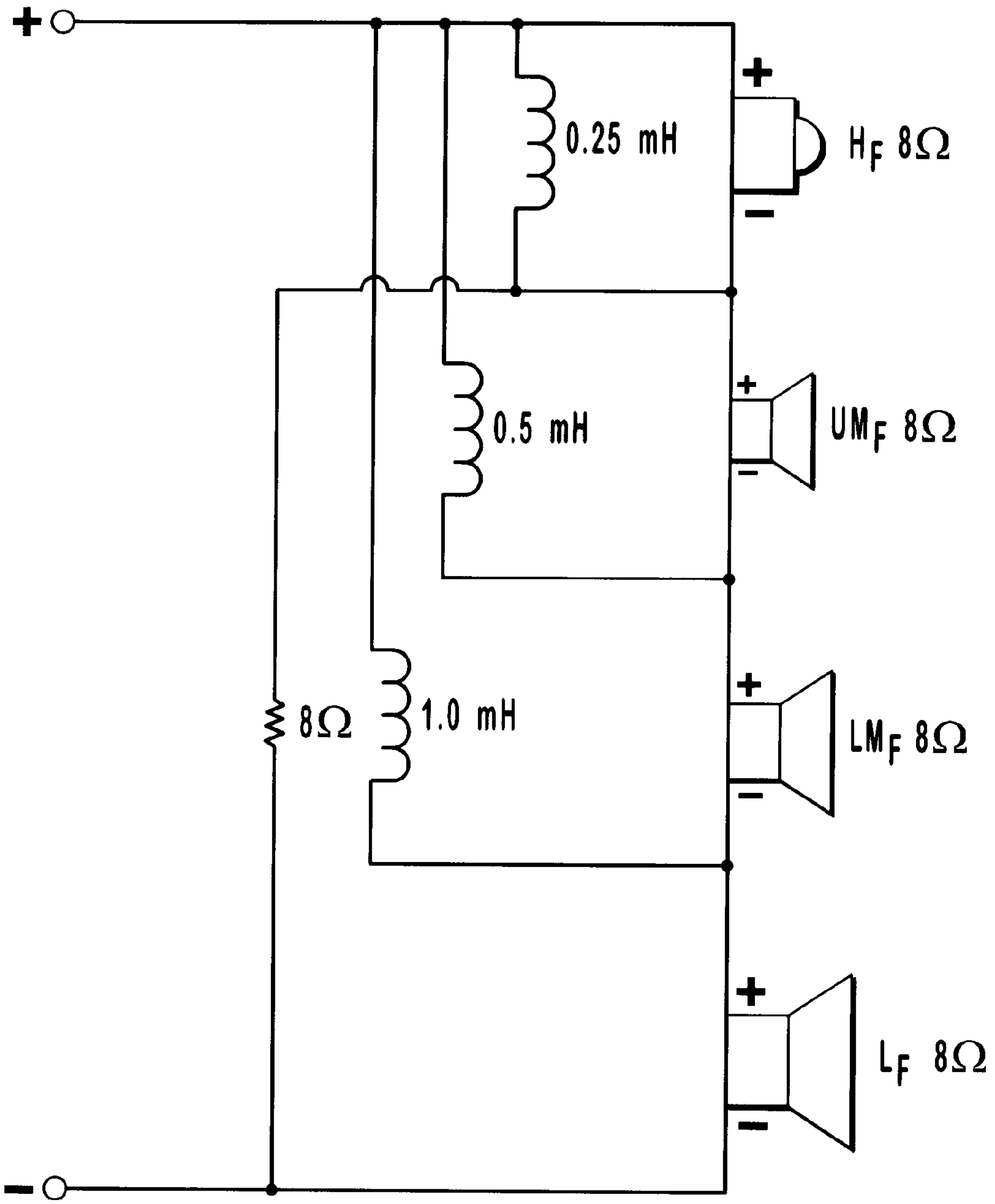
FIG. 9 depicts a simplified circuit diagram of an N-way series-parallel-configured capacitor-less crossover network, in accordance with a preferred embodiment of the present invention.

FIGS. 8–9 depict a simplified circuit diagram of an alternate embodiment incorporating parallel circuitry. In the previous embodiment of FIG. 6, inductor 64 is coupled in shunt across mid frequency driver 54. In the present embodiments of FIGS. 8 and 9, inductor 66 (FIG. 8) is instead connected in shunt across the driver at hand as well as all other higher frequency drivers. Such an implementation improves the gains of the network. Therefore, by adding such parallel circuitry the signal levels may be adjusted as well as the crossover frequency points. Because in the present embodiment, the high frequency drivers and low frequency drivers are wired in parallel, the overall gains in efficiency in those regions are improved. Likewise, FIG. 9 depicts a four-way system for alternatively an N-way series-configured capacitor-less crossover network employing the alternative shunt inductor configuration of the present invention.

Those skilled in the art appreciate that capacitors may be added to the circuit, for example, for the purposes of frequency shaping, and non linear gain functions. Such addition of capacitors are considered within the scope of the invention. It is further anticipated that extraneous capacitors may be added for the express purpose of "adding a capacitor" to provide marginal adjustments to the signals. Such nominal modifications are contemplated within the scope of the present invention.

Those skilled in the art also appreciate that the shunt resistor across the woofer may be eliminated by means of driver specification. An example would be a tweeter with sufficient effeciency.

The present invention may be embodied in other specific forms without departing from the spirit or essential characteristics. The described embodiments are to be considered in all respects as only illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. In an audio system, a series-configured, capacitor-less crossover network for partitioning by frequency an electrical audio signal as provided by at least one amplifier into a plurality of electrical audio frequency bands comprising at least one high frequency band and one low frequency band for powering a corresponding plurality of electro-acoustic transducers comprising at least one high frequency electro-acoustic transducer and a low frequency electro-acoustic transducer, said capacitor-less crossover network comprising:

(a) an input pair comprised of a positive input and a negative input as received from said at least one amplifier;

(b) an inductor having a first input end electrically coupled to said positive input of said input pair and a second input end for coupling in shunt with at least one of said high frequency electro-acoustic transducer; and (c) a shunt resistor having a first end electrically coupled to said second input end of said inductor, and said second end of said shunt resistor electrically coupled to said negative input of said input pair and for coupling to a negative input of said low frequency electro-acoustic transducer, said shunt resistor for coupling at least partially in shunt with said low frequency electro-acoustic transducer, said capacitor-less crossover network containing no discrete capacitors for partitioning said audio signals into said frequency bands.

2. In an audio system, the capacitor-less crossover network, as recited in claim 1, further comprising at least one first inductor for coupling in shunt with at least one mid-range frequency electro-acoustic transducer, each of at least one said first inductors coupled in series with others of said at least one inductors, said series of said at least one inductor having a first mid-range terminal end electrically coupled to said negative input end of said inductor and said series of at least one inductor also having a second mid-range terminal end for electrically coupling to a first input of said low frequency electro-acoustic transducer.

3. In an audio system, the capacitor-less crossover network, as recited in claim 2, wherein said at least one inductor is comprised of one inductor for coupling in shunt with one mid-range frequency electro-acoustic transducer, said one inductor having a first end electrically coupled to said negative input end of said inductor and a second end for electrically coupling with said first input of said lower frequency electro-acoustic transducer.

4. In an audio system, the capacitor-less crossover network, as recited in claim 3, comprising:

(a) said inductor attached in shunt with high frequency electro-acoustic transducer having a value of approximately 0.25 milliHenries;

(b) said inductor attached in shunt with mid frequency electro-acoustic transducer having a value of approximately 2 milliHenries; and (c) said shunt resistor having a value of approximately 10 ohms.

5. In an audio system, the capacitor-less crossover network, as recited in claim 1, wherein said capacitor-less crossover network is compatible for inter-operating with said high frequency and said low frequency electro-acoustic transducers of a dynamic electro-magnet type.

6. In an audio system, the capacitor-less crossover network, as recited in claim 1, wherein said capacitor-less crossover network is compatible for inter-operating with said high frequency electro-acoustic transducers of a piezoelectric type.

7. In an audio system, the capacitor-less crossover network, as recited in claim 1, wherein said capacitor-less crossover network is compatible for inter-operating with said high frequency and said low frequency electro-acoustic transducers of an electrostatic type.

8. An audio system, comprising:

(a) at least one high frequency electro-acoustic transducer;

(b) a low frequency electro-acoustic transducer; and (c) a series-configured, capacitor-less crossover network for partitioning by frequency an electrical audio signal as provided by at least one amplifier into a plurality of frequency bands comprising at least one high frequency band and one low frequency band for driving a corresponding plurality of electro-acoustic transducers comprising said at least one high frequency driver and said low frequency driver, said capacitor-less crossover network comprising:

(i) an input pair comprised of a positive input and a negative input as received from said at least one amplifier;

(ii) an inductor having a first input end electrically coupled to said positive input of said input pair and a second input end for coupling in shunt with one of said at least one high frequency electro-acoustic transducer; and (iii) a shunt resistor having a first end electrically coupled to said second input end of said at least one inductor and a second end electrically coupled to said negative input of said input pair for coupling to a negative input of said low frequency band electro-acoustic transducer, said shunt resistor for coupling at least partially in shunt with said low frequency electro-acoustic transducer, said series-configured capacitor-less crossover network containing no discrete capacitors for partitioning said audio signals into said frequency bands.

9. The audio system, as recited in claim 8, wherein said capacitor-less crossover network further comprises at least one inductor for coupling in shunt with at least one mid-range frequency electro-acoustic transducer, each of said at least one inductors coupled in a series with others of said at least one inductors, said series of said at least one inductor having a first terminal end electrically coupled to said negative input end of said inductor and said series of at least one inductor also having a terminal end for electrically coupling to a first input of said low frequency electro-acoustic transducer.

10. The audio system, as recited in claim 9, wherein said at least one inductor of said capacitor-less crossover network is comprised of one inductor coupled in shunt with one mid-range frequency electro-acoustic transducer, said one inductor having a first end electrically coupled to said second input end of said inductor coupled in shunt with high frequency driver, and a second end for electrically coupling with said first input of said low frequency electro-acoustic transducer.

11. The audio system, as recited in claim 10, wherein said capacitor-less crossover network is comprised of:

(a) an inductor connected in shunt with high frequency electro-acoustic transducer said inductor having a value of approximately 0.25 milliHenries;

(b) an inductor connected in shunt with mid-range frequency electro-acoustic transducer, said inductor having a value of approximately 2 milliHenries; and (c) said shunt resistor having a value of approximately 10 ohms.

12. The audio system, as recited in claim 8, wherein said capacitor-less crossover network is compatible for inter-operating with said high frequency electro-acoustic transducers and said low frequency electro-acoustic transducers of an electro-magnetic dynamic type.

13. The audio system, as recited in claim 8, wherein said capacitor-less crossover network is compatible for inter-operating with said high frequency electro-acoustic transducer of a piezoelectric type.

14. The audio system, as recited in claim 8, wherein said capacitor-less crossover network is compatible for inter-operating with said high frequency and said low frequency electro-acoustic transducers of an electrostatic type.

15. In an audio system, a series-configured, capacitor-less crossover network for partitioning by frequency an electrical audio signal into a plurality of frequency bands comprising a high frequency band and a low frequency band to drive a high frequency driver and a low frequency driver, respectively, said capacitor-less crossover network comprising:

(a) a positive input and a negative input forming an input pair for receiving said electrical audio signal an audio system amplifier;

(b) an inductor connected in shunt with the high frequency driver, having a first input end electrically coupled to said positive input of said input pair, said inductor also having a second input end, said inductor for coupling in shunt with said high frequency driver via said first and second input ends; and a shunt resistor having a first end electrically coupled to said second input end of said inductor, said shunt resistor also having a second end electrically coupled to said negative input of said input pair, said shunt resistor for coupling in shunt with said low frequency driver via said first and second ends, said capacitor-less crossover network containing no discrete capacitors for partitioning said audio signals into said frequency bands.

16. In an audio system, the series-configured, capacitor-less crossover network, as recited in claim 15, comprising:

a) an inductor connected in shunt with high frequency driver, said inductor having a value of approximately 0.25 milliHenries; and b) said shunt resistor having a value of approximately 10 ohms.

17. In an audio system, a series-configured, capacitor-less crossover network for partitioning by frequency an electrical audio signal into a plurality of frequency bands comprising a high frequency band, a mid-range frequency band and a low frequency band to drive a high frequency driver, a mid-range frequency driver and a low frequency driver, respectively, said capacitor-less crossover network comprising:

(a) a positive input and a negative input forming an input pair for receiving said electrical audio frequency signal from an audio system amplifier;

(b) a first inductor having a first input end electrically coupled to said positive input of said input pair, said first inductor also having a second input end, said first inductor for coupling in shunt with said high frequency driver via said first and second input ends;

(c) a second inductor coupled in series with said first inductor via a first input end electrically coupled to said second input end of said first inductor, said second inductor also having a first input end, said second inductor for coupling in shunt with said mid-range frequency driver via said first and second input ends; and (d) a shunt resistor having a first end electrically coupled to said second input end of said first inductor and said first input end of said second inductor, said shunt resistor also having a second end electrically coupled to said negative input of said input pair, said shunt resistor for coupling partially in shunt with said low frequency driver, said second input end of said second inductor and said second end of said shunt resistor for electrically coupling with said low frequency driver said capacitor-less crossover network containing no discrete capacitors for partitioning said audio signals into said frequency bands.

18. In an audio system, the series-configured, capacitor-less crossover network, as recited in claim 17, comprising:

a) a first inductor connected in shunt with high frequency driver, said inductor having a value of approximately 0.25 milliHenries;

b) a second inductor connected in shunt with mid-range frequency driver, said inductor having a value of 2 milliHenries; and c) said shunt resistor having a value of approximately 10 ohms.

19. In an audio system speaker, a series-configured, capacitor-less crossover network for partitioning by frequency an electrical audio signal into a plurality of frequency bands comprising a high frequency band, a mid-range frequency band and a low frequency band to drive a high frequency driver, a mid-range frequency driver and a low frequency driver, respectively, said capacitor-less crossover network comprising:

(a) a positive input and a negative input forming an input pair for receiving said electrical audio frequency signal from an audio system amplifier;

(b) a first inductor having a first input end electrically coupled to said positive input of said input pair, and to positive input end of high frequency driver, said first inductor also having a second input end for electrically coupling to negative input end of high frequency driver, said negative input end of high frequency driver is also electrically coupled to positive input end of mid-range frequency driver;

(c) a second inductor having a first end electrically coupled with said positive input of said input pair, and the said second inductor having a second end electrically coupled to the negative input end of said mid-range driver; and (d) a shunt resistor having a first end electrically coupled to said negative input end of said first inductor and said positive input end of said mid-range frequency band inductor, said shunt resistor also having a second end electrically coupled to said negative input of said input pair, said shunt resistor for coupling partially in shunt with said lower frequency band speaker, said capacitor-less crossover network containing no discrete capacitors for partitioning said audio signals into said frequency bands.

20. In an audio system, the series-configured, capacitor-less crossover network, as recited in claim 19, comprising:

a) said first inductor having a value of approximately 0.25 milliHenries;

b) said second inductor having a value of 2 milliHenries; and c) said resistor having a value of approximately 10 ohms.

* * * * *